United States Patent
Saijo et al.

(10) Patent No.: US 6,663,980 B1
(45) Date of Patent: Dec. 16, 2003

(54) CLAD PLATE FOR LEAD FRAMES, LEAD FRAME USING THE SAME, AND METHOD OF MANUFACTURING THE LEAD FRAME

(75) Inventors: Kinji Saijo, Ymaguchi-ken (JP); Kazuo Yoshida, Ymaguchi-ken (JP); Sinji Ohsawa, Ymaguchi-ken (JP)

(73) Assignee: Toyo Kohan Co., Ltd., Tokyo (JP)

( * ) Notice: Subject to any disclaimer, the term of this patent is extended or adjusted under 35 U.S.C. 154(b) by 0 days.

(21) Appl. No.: 09/806,532

(22) PCT Filed: Sep. 24, 1999

(86) PCT No.: PCT/JP99/05230

§ 371 (c)(1),
(2), (4) Date: Aug. 29, 2001

(87) PCT Pub. No.: WO00/19533

PCT Pub. Date: Apr. 6, 2000

(30) Foreign Application Priority Data

Sep. 30, 1998 (JP) .............................................. 10291378

(51) Int. Cl.$^7$ ........................ B32B 15/20; H01L 23/495
(52) U.S. Cl. ........................ 428/607; 428/652; 428/675; 228/205; 228/235.2; 257/673; 29/874
(58) Field of Search ................................ 428/652, 675, 428/607; 228/235.2, 205; 257/673; 29/874

(56) References Cited

U.S. PATENT DOCUMENTS

| | | | |
|---|---|---|---|
| 4,896,813 A | | 1/1990 | Saijo et al. |
| 5,001,546 A | * | 3/1991 | Butt ............................. 257/666 |
| 5,221,428 A | * | 6/1993 | Ohsawa et al. ................ 216/14 |
| 5,243,320 A | * | 9/1993 | Clouser et al. ............... 338/308 |
| 5,937,278 A | * | 8/1999 | Ito et al. ....................... 438/111 |
| 6,051,450 A | * | 4/2000 | Ohsawa et al. ............... 257/692 |
| 6,114,755 A | * | 9/2000 | Ito et al. ....................... 257/675 |
| 6,140,153 A | * | 10/2000 | Ohsawa et al. ............... 438/111 |
| 6,150,037 A | * | 11/2000 | Saijo et al. ................... 137/68.23 |
| 6,210,825 B1 | * | 4/2001 | Takada et al. ................. 429/53 |
| 6,257,267 B1 | * | 7/2001 | Saijo et al. ................... 137/68.23 |

FOREIGN PATENT DOCUMENTS

| | | | |
|---|---|---|---|
| JP | 1-218777 | * | 8/1989 |
| JP | 3-188660 A | | 8/1991 |
| JP | 3-204101 | * | 9/1991 |
| JP | 4-322889 | * | 11/1992 |
| JP | 6-81172 | * | 3/1994 |
| JP | 9-115965 | * | 5/1997 |
| WO | WO 97/30482 | * | 8/1997 |
| WO | WO 97/30483 | * | 8/1997 |
| WO | WO 98/06117 | * | 2/1998 |

OTHER PUBLICATIONS

IBM Technical Disclosure Bulletin, Apr. 1967, vol. 9, Issue No. 11, p. No. 1520–1521, "Molded Printed Circuits".*

* cited by examiner

Primary Examiner—John J. Zimmerman
(74) Attorney, Agent, or Firm—Browdy and Neimark, P.L.L.C.

(57) ABSTRACT

The present invention relates to a clad sheet for lead frame which can manufacture economically and has excellent characteristics, lead frame using thereof and manufacturing method thereof. A clad sheet for lead frame is manufactured by press-bonding copper foil to nickel foil at the reduction rate of 0.1 to 3%. Or, it is manufactured by press-bonding copper foil having nickel plating on one or both sides of it to the other copper foil at the reduction rate of 0.1 to 3%. Or, it is manufactured by press-bonding aluminum foil to nickel foil at the reduction rate of 0.1 to 3%. Further, it is also manufactured by press-bonding copper foil having nickel plating on one side of it to aluminum foil at the reduction rate of 0.1 to 3%. Clad sheet is comprising three layer of copper/nickel/copper or copper/nickel/aluminum.

4 Claims, 3 Drawing Sheets

CLAD PLATE FOR LEAD FRAMES, LEAD FRAME USING THE SAME, AND METHOD OF MANUFACTURING THE LEAD FRAME

REFERENCE TO RELATED APPLICATIONS

The present application is the national stage under 35 U.S.C. §371 of international application PCT/JP99/05230, filed Sep. 24, 1999, which designated the United States, and which application was not published in the English language.

INDUSTRIAL FIELD

The present invention relates to the method of manufacturing a lead frame, particularly that can be manufactured using a clad sheet formed by cold press-bonding method.

BACKGROUND OF THE INVENTION

Recently, accompanied with semiconductor device being more highly accumulated, having more pins and being smaller sized, and electronic equipment being smaller sized and lighter weighted, high density mount board is required.

In the method for connecting semiconductor chips to lead frames, a metal lead having bumps, which could minimize the assembly process, the size of package and the cost compared to the conventional wire-bonding method, has been researched and developed. In this method, jutting bumps are formed at the edge portion of a lead and the lead connects to semiconductor chip intervening theses bumps, which can make a package thin.

And now, as a method for forming bumps, a three layered clad sheet is tried to be used as a metallic material for manufacturing lead frame.

Japanese laid open publication No. Hei 9-115965 discloses a method of manufacturing a lead frame by using such three layer clad sheet. In this manufacturing method, a clad sheet is manufactured by holding a high hardness copper sheet between pure copper sheets.

However, in the method mentioned above, any etching stopper layer does not exist in the clad sheet, which causes a problem that the control of the chemical etching is extremely difficult.

There is also a method of manufacturing lead frame using three layer clad sheets in which aluminum or ferrous alloy is used as an etching stopper layer. But these clad sheets are formed by a usual cold rolling method using a higher reduction rate, which produce unflat bonding surface or form an alloy layer on a surface between a copper sheet and etching stopper layer during heat treatment, which causes inferior selective etching.

In addition, there is the other method of manufacturing a lead frame, in which thin metal film is formed by an vapor deposition method. However, there was a problem, that is, in case that the formed film is thin (several $\mu$m), pores are easily generated, while in case that the formed film is thick (10 $\mu$m or more), the productability is deteriorated and the cost becomes high.

The present invention is aimed to solve such problems, and the objective of the present invention is to produce a clad sheet for lead frame which can be manufactured at low cost and has an excellent selective etchability, a lead frame using thereof, and a manufacturing method thereof.

DISCLOSURE OF THE INVENTION

The clad sheet for lead frame is characterized in that it is manufactured by press bonding a copper foil to nickel foil at the reduction rate of 0.1 to 3%.

The copper foil has a nickel plating on one or both sides.

The clad sheet for lead frame is characterized in that it is manufactured by press bonding an aluminum foil to a nickel foil at the reduction rate of 0.1 to 3%.

The clad sheet for lead frame is characterized in that it is manufactured by press bonding a copper foil having nickel plating on one side of it to an aluminum foil at the reduction rate of 0.1 to 3%.

According to still another feature, the clad sheet for a lead frame is characterized in that it is composed of a three-layer construction comprising copper/nickel/copper.

According to a further feature, the clad sheet for a lead frame is alternatively characterized in that it is composed of a three-layer construction comprising copper/nickel/aluminum.

According to a still further feature, the lead frame is characterized in that bumps are formed by selectively etching the clad sheet.

The method of manufacturing the lead frame is preferably characterized by forming a clad sheet for lead frame by press-binding a copper foil or an aluminum foil to a nickel foil or a nickel copper foil which serve as an etching stopper layer, and then forming bumps of copper or aluminum by selectively etching the clad sheet.

The manufacturing method for the lead frame is preferably characterized in that:

said clad sheet for lead frame is formed by
  previously practicing an activation treatment of the bonding surface of said copper foil or aluminum foil and the bonding surface of said nickel foil or nickel plating in a vacuum chamber,
  laminating said copper foil or aluminum foil to said nickel foil and nickel plating, and then press-bonding at the reduction rate of 0.1 to 3%, wherein
said activation treatment is practiced
  ① in a hyper low pressure inert gas atmosphere of $1\times10^{-1}$ to $1\times10^{-4}$ Torr,
  ② by glow discharging charging an alternate current of 1 to 50 MHz between one electrode A comprising said copper foil or aluminum foil having bonding surface and said nickel foil or nickel plating respectively electrically ground and the other electrode B insulatingly supported, and
  ③ by sputter-etching
  ④ in the manner that the electrode area exposed in plasma generated by said glow discharging is not more than ⅓ the area of electrode B.

BEST MODE FOR CARRYING OUT THE INVENTION

Hereafter, the present invention is concretely explained referring to an embodiment shown in an attached figures.

Figure 7:
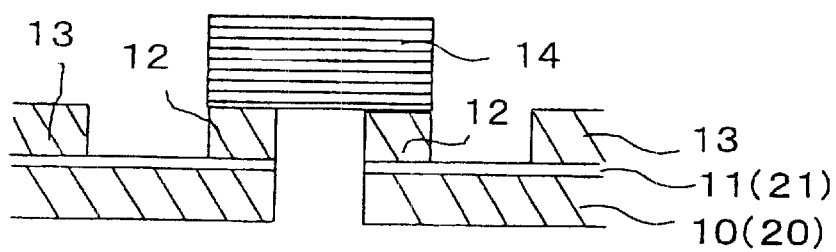
FIG. 7 is process explanatory drawing of the manufacturing method of lead frame relating to one embodiment of the present invention.

First of all, the structure of a lead frame relating to a embodiment of the present invention is explained referring to FIG. 7.

As shown in Figure, etching stopper layers 11 (thickness of 0.5 to 3 μm) comprising nickel foil (thickness of 5 to 10 μm) or nickel plating is connected to one side of outer lead layer 10 (thickness of 10 to 100 μm) comprising copper foil or aluminum foil 20, which forms a lead. Further, bump 12 (thickness of 10 to 100 μm) comprising copper foil 24 which is inner lead layer and external terminal 13 are formed. And, a lead frame is formed by connecting semiconductor chip 14 to bump 12.

Next, a manufacturing method of the above-mentioned lead frame is explained.

First of all, nickel plating 21 (thickness of 0.5 to 3 μm) which is to be etching stopper layer 11 is given to one side of copper foil 20 (thickness of 10 to 100 μm) which is to be outer lead layer 10 when a lead frame is manufactured. Thus, nickel plated copper foil 22 is manufactured (referred to FIG. 1).

Figure 8:
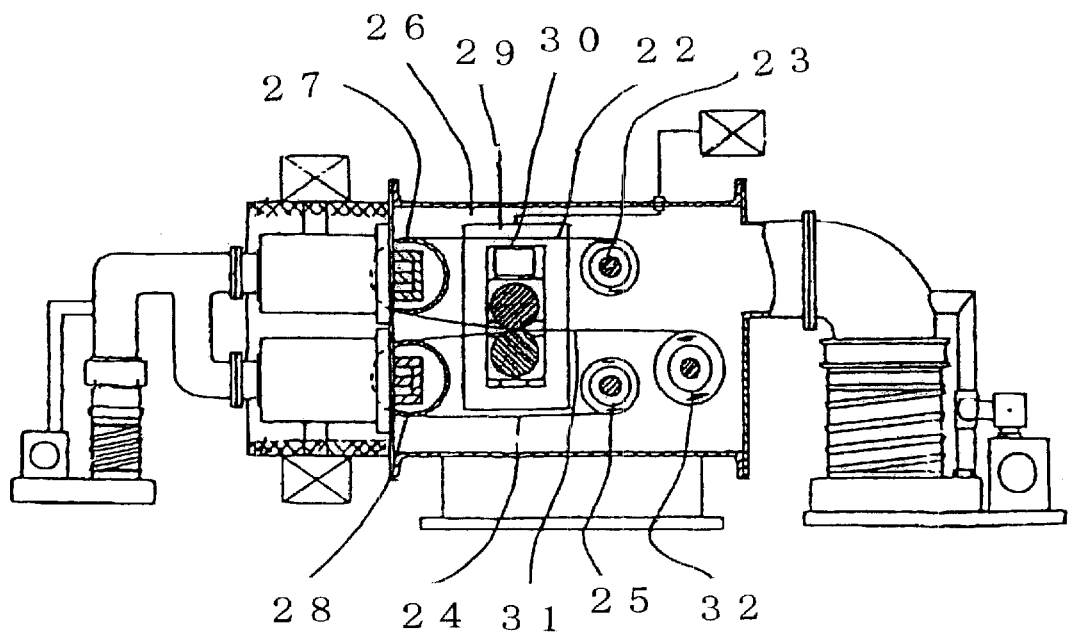
FIG. 8 is sectional front elevation of manufacturing equipment of clad metal sheet.

Nickel plated copper foil 22 is wound around pay-off reel 23 of a clad sheet manufacturing equipment shown in FIG. 8, while copper foil 24 which is to be inner lead layer is wound around pay-off reel 25.

Nickel plated copper foil 22 and copper foil 24 are rewound from pay-off reel 23 and 25 respectively at the same time. And portions of them are wound around electrode roll 27 and 28 which are projecting in etching chamber 26. After that, they are activated by sputter etching treatment in etching chamber 26.

In this case, the activation treatment is practiced by the following condition as disclosed in Japanese laid open patent number Hei 1-224184, namely ① in a hyper low pressure inert gas atmosphere of $1 \times 10^{-1}$ to $1 \times 10^{-4}$ Torr, ② by glow discharging charging an alternate current of 1 to 50 MHz between one electrode A comprising said copper foil or aluminum foil having bonding surface and said nickel foil or nickel plating respectively electrically ground and the other electrode B insulatingly supported, and ③ by sputter-etching ④ in the manner that the electrode area exposed in plasma generated by said glow discharging is not more than ⅓ the area of electrode B. After that, they are cold press-bonded by rolling unit 30 installed in vacuum chamber 29, and then clad sheet for lead frame having three layered structure is rewound around rewinding roll 32. Thus, clad sheet for lead frame is manufactured.

While the case of press-bonding a copper foil which is previously nickel plated is explained in the above-mentioned, a copper foil or an aluminum foil to which a nickel foil is press bonded using the above-mentioned equipment can also be available in place of nickel plating. In this case, three layered clad sheet intervened by a nickel layer as an intermediate layer in the order of copper/nickel/copper or copper/nickel/aluminum can be manufactured by repeating the press-bonding using the above-mentioned equipment.

The manufacturing method in this case is described below.

First of all, copper foil or aluminum foil 20 (thickness of 10 to 100 μm) which is to be outer lead layer when lead frame is manufactured (referred to FIG. 1) is wound around pay-off reel 23 of clad sheet manufacturing equipment shown in FIG. 8. Nickel foil 21 (thickness of 5 to 10 μm) which is to be etching stopper layer 11 is wound around pay-off reel 25.

Copper foil or aluminum foil 20 and nickel foil 21 are rewound from pay-off reel 23 and 25 respectively at the same time. And portions of them are wound around electrode roll 27 and 28 which are projecting in etching chamber 26. And then, the bonding surfaces are activated by sputter etching treatment in etching chamber 26. After that, they are cold press-bonded by rolling unit 30 in the manner that the activated surfaces are bonding surfaces. Thus copper foil or aluminum foil 22 with nickel foil and having two layered structure is manufactured. After that, this two layered clad sheet is wound around winding roll 32.

Next, copper foil or aluminum foil 22 with nickel foil having two layered structure is wound again around pay-off reel 23. Copper foil 24 which is to be inner lead layer is wound around pay-off reel 25.

Copper foil or aluminum foil 22 with nickel foil and copper fill 24 are rewound from pay-off reel 23 and 25 respectively at the same time. And portions of them are wound around electrode roll 27 and 28 which are projecting in etching chamber 26. After that, they are activated by sputter etching treatment in etching chamber 26.

Figure 1:
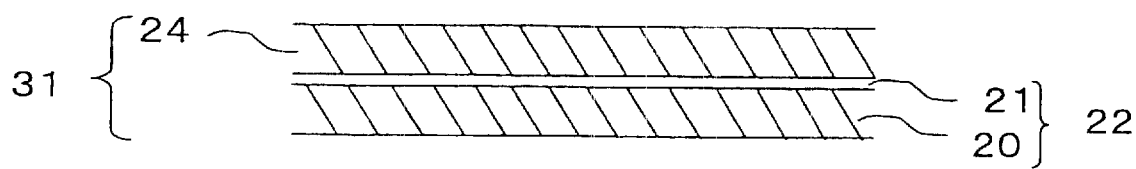
FIG. 1 is process explanatory drawing of the manufacturing method of lead frame relating to one embodiment of the present invention.

In this case, the activation treatment is also practiced by the following condition, namely ① in a hyper low pressure inert gas atmosphere of $1 \times 10^{-1}$ to $1 \times 10^{-4}$ Torr, ② by glow discharging charging an alternate current of 1 to 50 MHz between one electrode A comprising said copper foil or aluminum foil 22 with nickel foil having bonding surface and said nickel foil or nickel plating respectively electrically ground and the other electrode B insulatingly supported, and ③ by sputter-etching ④ in the manner that the electrode area exposed in plasma generated by said glow discharging is not more than ⅓ the area of electrode B. Thus clad sheet 31 for lead frame having three layered structure is manufactured as shown in FIG. 1.

In addition, it is also possible to manufacture a multi-layered clad sheet in single press-bonding by installing three or more of the above-mentioned pay-off reels, setting copper foil or aluminum foil and nickel foil on these pay-off reels, and simultaneously supplying foils from three or more of pay-off reels.

Next, after clad sheet 31 for lead frame is cut into desired size, lead frame and bump are manufactured through the following processes as explained referring to FIGS. 2 to 7.

Figure 2:
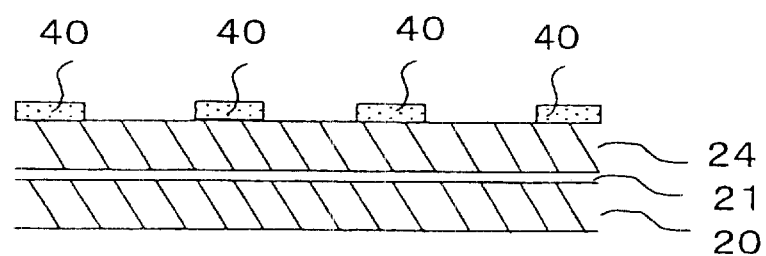
FIG. 2 is process explanatory drawing of the manufacturing method of lead frame relating to one embodiment of the present invention.

First of all, after photo resist is coated on the surface of copper foil 24 as shown in FIG. 2, photo resist film 40 is formed by exposing and printing.

Figure 3:
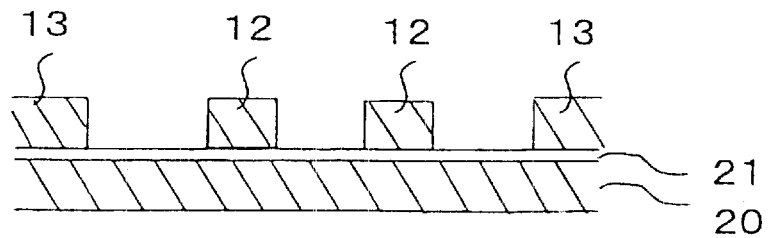
FIG. 3 is process explanatory drawing of the manufacturing method of lead frame relating to one embodiment of the present invention.

Then, copper foil 24 is removed by selective etching using a solution of sulfuric acid plus hydrogen peroxide so that bump 12 and external terminal 13 are left as shown in FIG. 3. It takes about four minutes, for instance, for etching. In the case where aluminum foil is etched, sodium hydroxide solution is used.

Figure 4:
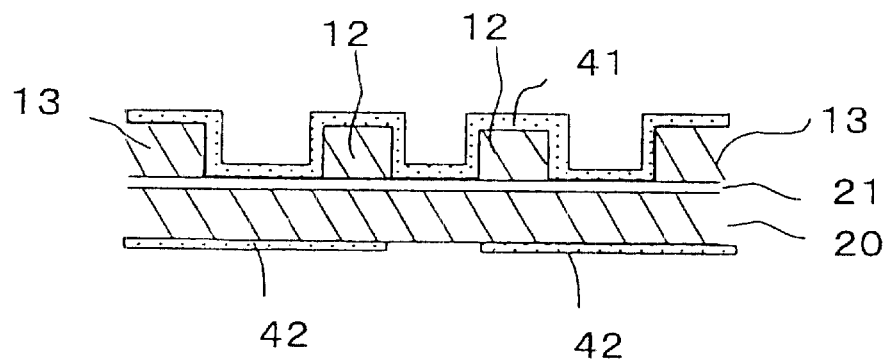
FIG. 4 is process explanatory drawing of the manufacturing method of lead frame relating to one embodiment of the present invention.

Then, photo resist film 41 is formed on the surface of bump 12 and external terminal 13, and further, after photo resist is coated on the surface of copper foil or aluminum foil 20 which is to be outer lead layer 10, photo resist film 42 is formed by exposing and printing as shown in FIG. 4.

Figure 5:
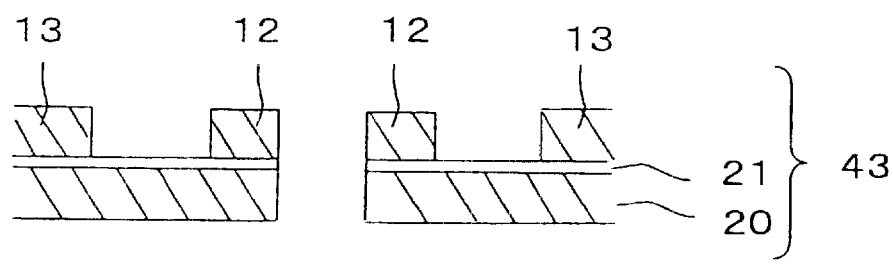
FIG. 5 is process explanatory drawing of the manufacturing method of lead frame relating to one embodiment of the present invention.

Next, copper foil 20 and nickel plating or nickel foil 21 which are to be outer lead layer 10 is etched using ferric chloride, cupric chloride or the like, after that, conductor circuit 43 is formed by removing photo resist film 41 and 42 as shown in FIG. 5.

Moreover, in the case where aluminum foil 20 is etched, 5% solution of sodium hydroxide or potassium hydroxide (50° C.) is used as etchant. It takes about two minutes, for instance, for etching. After that, conductor circuit 43 is formed by etching nickel plating or nickel foil 21 using ferric chloride, cupric chloride or the like.

Figure 6:
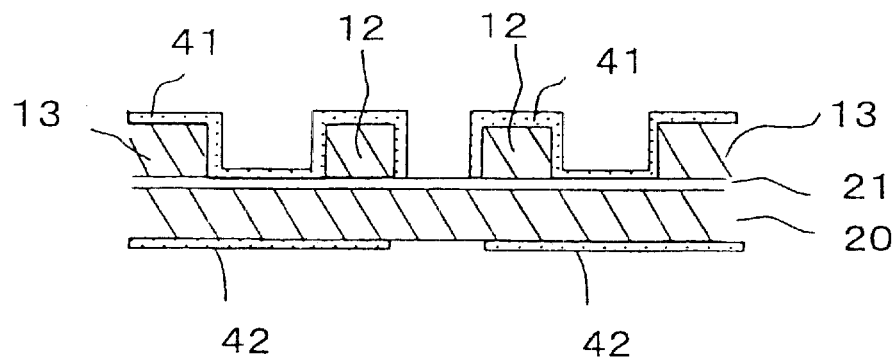
FIG. 6 is process explanatory drawing of the manufacturing method of lead frame relating to one embodiment of the present invention.

Or, instead of selective etching from the side of outer lead layer as shown in FIG. 4, photo resist film 41 can be formed on the top surface and the side surface of bump 12 and external terminal 13 so that photo resist film 41 is not formed on the bottom portions between bumps, and further, photo resist film 42 can be formed on the surface of copper foil or aluminum foil 20 which is to be outer lead layer 10 as shown in FIG. 6.

In this case, etching can be processed from the side of nickel plating or nickel foil 21 toward copper foil 20 on the side of outer lead layer using ferric chloride, cupric chloride or the like.

And, in the case where aluminum foil 20 is formed, nickel plating or nickel foil 21 is first etched using ferric chloride, cupric chloride or the like. After that, aluminum foil 20 is etched using 5% solution of sodium hydroxide or potassium hydroxide (50° C.).

And then, semiconductor chip 14 is connected to bump 12 as shown in FIG. 7.

POSSIBILITY OF USE INVENTION

As mentioned above, in the clad sheet for lead frame of the present invention, the clad sheet is manufactured by press-bonding copper foil or aluminum foil to nickel foil, or press-bonding copper foil having nickel plating on one or both sides of it to the other copper foil in the state that both foils are laminated. Therefore, the generation of pore caused in the vapor deposition method can be avoided and the quality can be improved. And, since the clad sheet can merely be manufactured by laminating and press-bonding, the manufacturing cost of the clad sheet for a lead frame can be reduced.

Moreover, the flatness on the bonding surface can be maintained by suppressing the stress on the bonding surface to low since the press-bonding is practiced at the low reduction rate of 0.1 to 3%. And further, heat treatment for the recovery of formability is also unnecessary, and the alloy layer is not caused on the interface. Therefore, lead frame excellent in the selective etching can be manufactured by using this clad sheet for lead frame.

In another embodiment, bumps are formed by selectively etching the above-mentioned clad sheet for lead frame. Therefore, a thin lead frame can be manufactured efficiently and economically.

In the method of manufacturing the lead frame of another embodiment, clad sheet for lead frame is formed by laminating and press-bonding copper foil or aluminum foil which forms lead layer to nickel plating or nickel foil which forms etching stopper layer. After that, lead frame is manufactured by selectively etching the above-manufactured multi-layered clad sheet and forming bump comprising copper or aluminum. Therefore, a thin lead frame having uniform bumps can be manufactured efficiently and economically.

In the manufacturing method of lead frame of still another embodiment, after bonding surfaces of copper foil or aluminum foil and nickel plating or nickel foil are Previously activated in a vacuum chamber, the copper foil or aluminum foil is laminated to the nickel plating or nickel foil and press-bonding at the reduction rate of 0.1 to 3%. Thus the clad sheet for lead frame is formed. Therefore, the flatness of the bonding surface can be maintained by suppressing the stress on the bonding surface to low. Moreover, heat treatment for the recovery of formability is also unnecessary, and the alloy is not caused on the interface. Therefore, lead frame excellent in the selective etching can be manufactured by using this multi-layered clad sheet.

What is claimed is:

1. A clad sheet comprising Cu/Ni/Al for lead frame manufactured by press-bonding a copper foil having nickel plating on one side of it to an aluminum foil at the reduction rate of 0.1 to 3%.

2. A lead frame in which bumps are formed by selectively etching the clad sheet according to claim 1.

3. A manufacturing method of lead frame comprising:
   a. forming a clad sheet comprising Cu/Ni/Al or Ni/Cu/Ni/Cu for lead frame by press-bonding a copper foil or an aluminum foil to a nickel foil or a nickel plated copper foil which serve as etching stopper layer, and then;
   b. forming bumps of copper or aluminum by selectively etching the clad sheet.

4. The method according to claim 3 wherein the clad sheet for lead frame is formed by previously activating the bonding surface of the copper foil or the aluminum foil and the bonding surface of the nickel foil or nickel plating in a vacuum chamber, laminating the copper foil or aluminum foil to the nickel foil or nickel plating, and press-bonding at a reduction rate of 0.1 to 3%;
   wherein the activation treatment is practiced
   a. in a hyper low pressure inert gas atmosphere of 1×10−1 to 1×10−4 Torr;
   b. by glow discharging charging an alternate current of 1 to 50 MHz between one electrode A comprising the copper foil or aluminum foil having bonding surface and the nickel foil or nickel plating, respectively, electrically grounded, and another electrode, electrode B, insulatingly supported, and
   c. by sputter-etching
   d. in the manner that the electrode area exposed in a plasma generated by the glow discharging is not more than ⅓ the area of electrode B.

* * * * *